(12) United States Patent
Nakabayashi et al.

(10) Patent No.: US 7,570,056 B2
(45) Date of Patent: Aug. 4, 2009

(54) MAGNETIC RESONANCE IMAGING APPARATUS

(75) Inventors: Kazuto Nakabayashi, Nasushiobara (JP); Kazuya Okamoto, Saitama (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 45 days.

(21) Appl. No.: 11/501,893

(22) Filed: Aug. 10, 2006

(65) Prior Publication Data

US 2007/0035301 A1 Feb. 15, 2007

(30) Foreign Application Priority Data

Aug. 10, 2005 (JP) ............... 2005-231981

(51) Int. Cl.
*G01V 3/00* (2006.01)
(52) U.S. Cl. ...................................... 324/318
(58) Field of Classification Search ............... 324/318
See application file for complete search history.

(56) References Cited

U.S. PATENT DOCUMENTS

| | | | |
|---|---|---|---|
| 4,684,894 A * | 8/1987 | Bliehall ...................... 324/318 |
| 5,197,474 A * | 3/1993 | Englund et al. ............. 600/415 |
| 5,490,508 A * | 2/1996 | Kato .......................... 600/422 |
| 5,808,468 A | 9/1998 | Bis et al. |
| 5,928,148 A | 7/1999 | Wang et al. |
| 6,493,571 B1 * | 12/2002 | Bis et al. ..................... 600/420 |
| 2005/0242812 A1 * | 11/2005 | Okamoto et al. ............ 324/318 |

FOREIGN PATENT DOCUMENTS

| | | | |
|---|---|---|---|
| JP | 1-166747 A | 6/1989 |
| JP | 2-68036 A | 3/1990 |
| JP | 3-71892 A | 11/1991 |

* cited by examiner

*Primary Examiner*—Brij B. Shrivastav
*Assistant Examiner*—Megann E Vaughn
(74) *Attorney, Agent, or Firm*—Nixon & Vanderhye PC (57) ABSTRACT

A coil support unit for use in a magnetic resonance imaging apparatus provided with a top board for placing thereon a subject, and a radio frequency coil provided on an upper surface of the top board, the magnetic resonance imaging apparatus imaging the subject utilizing the radio frequency coil, the coil support unit includes a port configured to electrically connect the radio frequency coil to a signal cable, the signal cable transmitting at least one of a transmission signal supplied to the radio frequency coil, and a magnetic resonance signal detected by the radio frequency coil, and a support member provided on the upper surface of the top board and including a guide groove formed therein, the guide groove permitting the port to slide therein.

17 Claims, 6 Drawing Sheets

MAGNETIC RESONANCE IMAGING APPARATUS

CROSS-REFERENCE TO RELATED APPLICATIONS

This application is based upon and claims the benefit of priority from prior Japanese Patent Application No. 2005-231981, filed Aug. 10, 2005, the entire contents of which are incorporated herein by reference.

BACKGROUND OF THE INVENTION

1. Field of the Invention

The present invention relates to a magnetic resonance imaging apparatus for imaging a subject utilizing magnetic resonance phenomena.

2. Description of the Related Art

In magnetic resonance imaging (MRI), atomic nucleus spins in biological tissue placed in static magnetic field are excited by a radio wave of Larmor frequency, and an image is reconstructed based on a magnetic resonance signal (MR signal) generated during the excitation. Since a magnetic resonance imaging apparatus (MRI apparatus) for imaging a subject using MRI can provide various types of diagnostic information, such as anatomic diagnostic information, biochemical information and diagnostic function information, it is very important in the field of current diagnostic imaging.

To generate a high-quality image using an MRI apparatus, it is necessary to efficiently detect a weak MR signal output from a subject. To this end, many technical devices are employed. Various types of radio frequency coils (RF coils) for detecting MR signals, such as a saddle type, solenoid type, slot resonator type, and birdcage type, are now available. Further, an optimal type of RF coil is selected and used in accordance with the frequency band, to-be-diagnosed portion, type of magnet, etc. For instance, in a horizontal-magnetic-field MRI apparatus using a cylindrical magnet, a birdcage type coil or saddle type coil is used. In a vertical-magnetic-field MRI apparatus, a solenoid coil is used. For to-be-diagnosed portions of a subject, such as the head and eyeballs, a surface coil excellent in detection sensitivity is used.

MRI apparatuses also require an RF coil for transmitting an RF signal. There is a case where different RF coils are provided for transmission and reception. However, a single RF coil may be used in common for transmission and reception.

For MRI apparatuses, there is a wide-range imaging method for performing imaging while sliding a subject in a direction parallel to the axis of the body. To realize such imaging, a method, for example, has been proposed in which an RF coil is fixed to the top board of a bed using support posts, and a subject placed on a support member is slid between the RF coil and top board (see, for example, U.S. Pat. No. 5,808,468).

Figure 6:
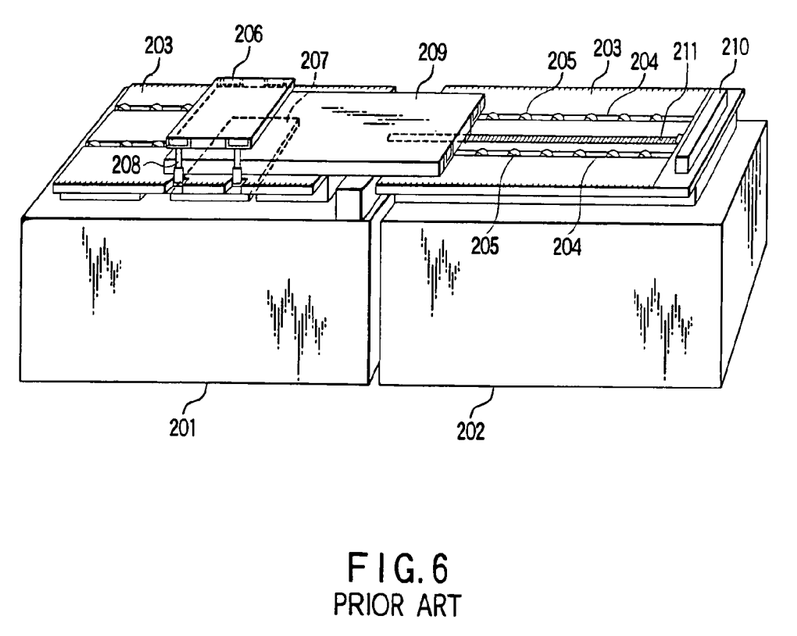
FIG. 6 is a perspective view illustrating the subject-moving mechanism described in U.S. Pat. No. 5,808,468.

FIG. 6 is a perspective view illustrating the subject-moving mechanism described in U.S. Pat. No. 5,808,468.

As shown, a top board 203 is placed on the top surfaces of a bed 201 and auxiliary bed 202. A plurality of rollers 205 are fitted in two grooves 204 formed in the top board 203 in the longitudinal direction of the board. Upper and lower surface coils 206 and 207 are fixed to the top board 203 using support posts 208.

A support plate 209 for placing a subject thereon is provided slidably with respect to the top board 203, supported by the rollers 205. Accordingly, the support plate 209 and a subject (not shown) placed thereon are slidable between the top board 203 and upper surface coil 206. When a worm drive 211 is rotated by a motor 210 mounted on an end of the auxiliary bed 202, the support plate 209 and subject are slid in the longitudinal direction (i.e., in the direction of the body axis of the subject).

By shifting the subject relative to the fixed RF coils 206 and 207, using the top board 203, the portion of the subject positioned near the RF coils 206 and 207, i.e., the portion as a target of imaging, can be changed.

However, during imaging, it is necessary to locate the RF coils 206 and 207 near the center of the static magnetic field generated in the gantry. In the above-described structure, the RF coils 206 and 207 are located with the support plate 209 interposed there between. Since the support plate 209 is thick so as to support the weight of a subject, it is difficult to remove the RF coils 206 and 207. Further, since the RF coil 206 is fixed at the center of the static magnetic field, to move the imaging target portion of the subject to the center of the static magnetic field, the head of the subject may be passed through the center of the static magnetic field. At this time, the head of the subject passes near the RF coil 206, which may well constitute a physiological pressure on the subject.

BRIEF SUMMARY OF THE INVENTION

Under the above-described circumstances, there has been a demand for a technique for moving an RF coil along with a top board on which a subject is placed, and also changing the relative positions of the subject and RF coil.

According to a first aspect of the present invention, there is provided a coil support unit for use in a magnetic resonance imaging apparatus provided with a top board for placing thereon a subject, and a radio frequency coil provided on an upper surface of the top board, the magnetic resonance imaging apparatus imaging the subject utilizing the radio frequency coil, the coil support unit comprising: a port configured to electrically connect the radio frequency coil to a signal cable, the signal cable transmitting at least one of a transmission signal supplied to the radio frequency coil, and a magnetic resonance signal detected by the radio frequency coil; and a support member provided on the upper surface of the top board and including a guide groove formed therein, the guide groove permitting the port to slide therein.

According to a second aspect of the present invention, there is provided a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising: a coil support unit supporting the radio frequency coil and including: a port configured to electrically connect the radio frequency coil to a signal cable, the signal cable transmitting at least one of a transmission signal supplied to the radio frequency coil, and the magnetic resonance signal; and a support member provided on an upper surface of the top board and including a guide groove formed therein, the guide groove permitting the port to slide therein.

According to a third aspect of the present invention, there is provided a radio frequency coil unit for use in a magnetic resonance imaging apparatus for imaging a subject placed on a top board and positioned in a static magnetic field, based on a magnetic resonance signal emitted from the subject when a gradient magnetic field and a radio frequency pulse are applied to the subject, the radio frequency coil unit comprising: at least one radio frequency coil configured to perform at least one of transmission of the radio frequency pulse and detection of the magnetic resonance signal; a port configured to electrically connect the at least one radio frequency coil to a signal cable, the signal cable transmitting at least one of a transmission signal supplied to the at least one radio frequency coil, and a magnetic resonance signal detected by the at least one radio frequency coil; and a slide unit configured to slide the port in a body axis direction of the top board.

According to a fourth aspect of the present invention, there is provided a magnetic resonance imaging apparatus comprising: a unit configured to generate a static magnetic field; a unit configured to apply a gradient magnetic field to a subject positioned in the static magnetic field; a unit configured to apply a radio frequency pulse to the subject; a radio frequency coil configured to receive a magnetic resonance signal emitted from the subject; a bed including a top board on which the subject is placed, the top board being slidable in a body axis direction thereof; a unit configured to generate a magnetic resonance image based on the magnetic resonance signal; and a coil support unit including a port which electrically connects the radio frequency coil to a signal cable transmitting the magnetic resonance signal, the port being slidable on the top board in the body axis direction thereof.

According to a fifth aspect of the present invention, there is provided a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising: a port configured to electrically connect the radio frequency coil to a signal cable, the signal cable transmitting at least one of a transmission signal supplied to the radio frequency coil, and the magnetic resonance signal, and wherein an upper surface of the top board includes a guide groove formed therein, the guide groove permitting the port to slide therein.

According to a sixth aspect of the present invention, there is provided a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising: a port configured to electrically connect the radio frequency coil to a signal cable, the signal cable transmitting at least one of a transmission signal supplied to the radio frequency coil, and the magnetic resonance signal; a support member provided on an upper surface of the top board and including a guide groove formed therein, the guide groove permitting the port to slide therein; and a moving unit configured to move the port along the guide groove.

According to a seventh aspect of the present invention, there is provided a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising: an upper coil provided above the top board and used as the radio frequency coil; a port configured to electrically connect the upper coil to a signal cable, the signal cable transmitting at least one of a transmission signal supplied to the upper coil, and the magnetic resonance signal; a support member provided on an upper surface of the top board and including a guide groove formed therein, the guide groove permitting the port to slide therein; and a lower coil provided below the upper surface of the top board and used as the radio frequency coil.

According to a eighth aspect of the present invention, there is provided a control method for controlling a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus including: a port configured to electrically connect the radio frequency coil to a signal cable, the signal cable transmitting at least one of a transmission signal supplied to the radio frequency coil, and the magnetic resonance signal; a support member provided on an upper surface of the top board and including a guide section which permits the port to slide along the guide section; and a moving unit configured to move the port along the guide section, the control method comprising: stopping the moving unit until the radio frequency coil reaches a predetermined position in accordance with movement of the top board; and moving the radio frequency coil at substantially a same speed as a moving speed of the top board in a direction opposite to a moving direction of the top board after the radio frequency coil reaches the predetermined position.

According to a ninth aspect of the present invention, there is provided a control method for controlling a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus including a moving unit which moves a port in a body axis direction of the top board, the port electrically connecting the radio frequency coil to a signal cable, the signal cable transmitting at least one of a transmission signal supplied to the radio frequency coil, and the magnetic resonance signal, the control method comprising: maintaining a position of the radio frequency coil relative to the subject, until the radio frequency coil reaches a predetermined position in accordance with movement of the top board; and changing the position of the radio frequency coil relative to the subject in the body axis direction of the top board, with a position of the radio frequency coil relative to the predetermined position unchanged, after the radio frequency coil reaches the predetermined position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the invention will be described with reference to the accompanying drawings.

In the embodiment, two support members are attached to a top board for placing a subject thereon. The support members are used to support an RF coil so that the coil can slide, and have guide grooves formed therein for permitting the RF coil to slide. End portions of signal cables capable of transmitting, to the RF coil, at least one of a transmission signal and a received signal are connected to connection ports, with and from which the ends of the RF coil can be attached and detached. In accordance with the movement of the RF coil, the connection ports attached with the RF coil, and the signal cables connected to the connection ports are moved along the guide grooves.

Based on the moving direction of the top board with a subject placed thereon, and the distance over which the top board is moved, a moving mechanism moves the RF coil by the same distance in the direction opposite to the moving direction of the top board. Accordingly, the RF coil is positioned in the generated static magnetic field and gradient magnetic fields, regardless of the distance over which the top board and subject are moved. MRI photography is performed on the portion of the subject positioned near the RF coil.

Figure 1:
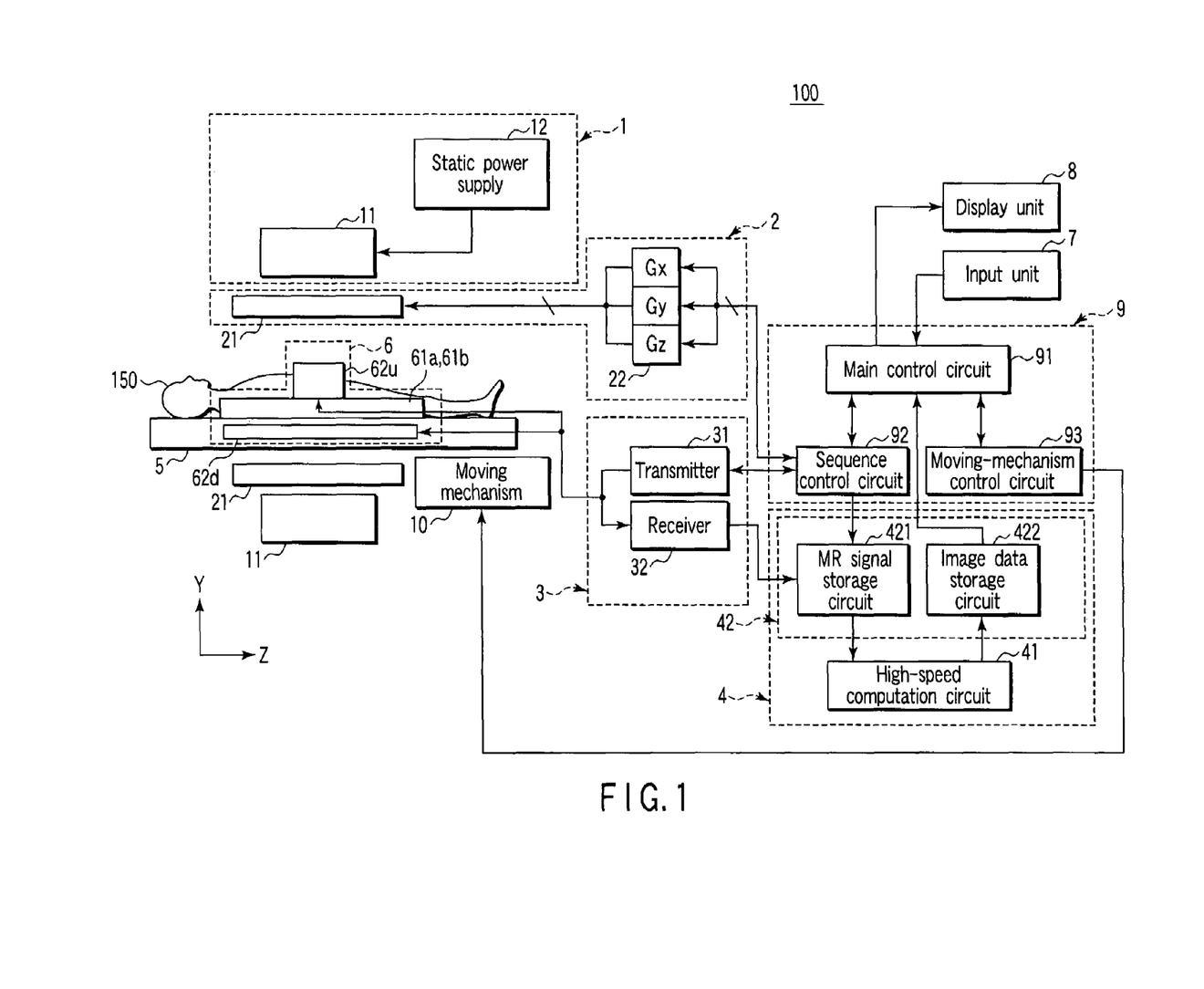
FIG. 1 is a block diagram illustrating an MRI apparatus according to an embodiment of the invention.

FIG. 1 illustrates an MRI apparatus 100 according to the embodiment.

The MRI apparatus 100 comprises a static field generation unit 1, gradient field generation unit 2, transmission/reception unit 3, computation/storage unit 4, top board 5, RF coil unit 6, input unit 7, display unit 8, control unit 9 and moving mechanism 10.

The static field generation unit 1 includes a main magnet 11 and static power supply 12. The main magnet 11 is, for example, a superconducting magnet. The static power supply 12 supplies a current to the main magnet 11. Upon receiving the current, the main magnet 11 generates a strong static magnetic field.

The gradient field generation unit 2 includes a gradient field coil 21 and gradient power supply 22. The gradient field coil 21 includes coil elements corresponding to X-, Y- and Z-directions. The coil elements generate X-, Y- and Z-directional gradient magnetic fields perpendicular to each other. The gradient power supply 22 supplies currents to the coil elements of the gradient field coil 21. The gradient field coil 21 superposes the resultant gradient magnetic fields upon the static magnetic field. The gradient power supply 22 receives control signals from the control unit 9, and changes the currents, supplied to the coil elements of the gradient field coil 21, in accordance with the control signals. Thus, the gradient field generation unit 2 generates arbitrary gradient magnetic fields for arbitrarily encoding the static magnetic field. In other words, the X-, Y- and Z-directional gradient magnetic fields are synthesized to set perpendicular gradient magnetic fields in arbitrary directions for slice selection, phase encoding and reading (frequency encoding), by changing the pulse currents, supplied from the gradient magnetic field power supply 22 to the X-, Y- and Z-directional coil elements of the gradient field coil 21, in accordance with the above-mentioned control signals.

The main magnet 11 and gradient field coil 21 are received in a gantry. Further, the center of the static magnetic field is positioned in a hollow of the gantry.

The transmission/reception unit 3 includes a transmitter 31 and receiver 32. The transmitter 31 is provided with a reference signal generator, modulator and power amplifier, etc., and acquires an RF transmission signal by modulating a reference signal of the same frequency as the magnetic resonance frequency (Larmor frequency) determined from the intensity of a static magnetic field. The transmitter 31 supplies the transmission signal to the RF coil unit 6. The receiver 32 subjects an MR signal, output from the RF coil unit 6, to intermediate frequency conversion, phase detection, filtering and then A/D conversion. The receiver 32 is provided with a 90° phase shifter for performing phase alignment on MR signals, when the MR signals are generated by a volume coil of the QD scheme and have a phase difference of 90°.

The computation/storage unit 4 includes a high-speed computation circuit 41 and storage circuit 42. The storage circuit 42 includes an MR signal storage circuit 421 and image data storage circuit 422. The MR signal storage circuit 421 stores MR signals digitized by the receiver 32. The image data storage circuit 422 stores image data generated by the high-speed computation circuit 41. The high-speed computation circuit 41 performs two-dimensional Fourier transform on the MR signals stored in the image data storage circuit 422, thereby generating image data in the real space.

The top board 5 is an element incorporated in a bed, and is slim and thin. The top board 5 can be longitudinally slid by the base section of the bed. A subject 150 is placed on the upper surface of the top board 5, such that the axis of the subject is substantially parallel to the longitudinal direction of the board 5. Accordingly, the top board 5 conveys the subject 150 in the direction of the body axis. The top board 5 conveys the subject 150 into the static magnetic field from the outside. The top board 5 moves the subject 150 relative to the static magnetic field to set an arbitrary imaging portion of the subject 150.

The RF coil unit 6 includes a coil support unit 61, upper RF coil 62u and lower RF coil unit 62d. The coil support unit 61 is provided on the upper surface of the top board 5 for supporting the upper RF coil 62u so that the upper RF coil 62u is kept separate from the top board 5 and slidable in the longitudinal direction of the top board 5. The upper RF coil 62u transmits an RF pulse signal based on a transmission signal from the transmitter 31. Further, the upper RF coil 62u detects an MR signal output from the subject 150. The lower RF coil unit 62d is buried in the top board 5. The lower RF coil unit 62d transmits an RF pulse based on a transmission signal from the transmitter 31. Further, the lower RF coil unit 62d detects an MR signal output from the subject 150.

The input unit 7 includes various input devices provided on its operation board, such as switches, keyboard and mouse. The input unit 7 acquires information and instructions input by an operator. The information acquired by the input unit 7 is, for example, various types of information concerning the subject 150, and information concerning a photography scheme, a photography condition, such as a pulse sequence, and a display condition. The instructions acquired by the input unit 7 are, for example, an instruction to perform photography, and an instruction to move the top board 5.

The display unit 8 is provided with a video memory, conversion circuit and monitor. When image data is sent from the image data storage circuit 422 to the display unit 8 via the control unit 9, the display unit 8 stores the image data in the video memory. In the video memory, the image data and attendant information, such as subject information, input through the input unit 7 are synthesized. The resultant image data is supplied to the conversion circuit, where it is subjected to TV format conversion and D/A conversion. As a result, the image data is converted into an image signal. The image signal is supplied to the monitor, where an image corresponding to the image signal is displayed. The monitor is, for example, a cathode ray tube (CRT) or liquid crystal display (LCD).

The control unit 9 includes a main control circuit 91, sequence control circuit 92 and moving-mechanism control circuit 93. The main control circuit 91 includes a CPU and storage circuit, and controls the entire MRI apparatus 100. The storage circuit of the main control circuit 91 stores information concerning the photography conditions or display conditions acquired through the input unit 7. The CPU of the main control circuit 91 supplies pulse sequence information to the sequence control circuit 92 based on the information stored in the storage circuit. The pulse sequence information concerns, for example, the amounts of current supplied to the gradient field coil 21, the level of a transmission signal, the time period of voltage application or voltage application timing. The sequence control circuit 92 includes a CPU and storage circuit, and controls the gradient power supply 22, transmitter 31 and receiver 32 in accordance with the pulse sequence information. The moving-mechanism control circuit 93 includes a CPU and storage circuit, and generates control signals for moving the top board 5 and upper RF coil 62*u*, and supplies them to the moving mechanism 10.

The moving mechanism 10 includes a top-board-moving mechanism and RF-coil-moving mechanism. The top-board-moving mechanism moves the top board 5 in the longitudinal direction thereof. The RF-coil-moving mechanism moves the upper RF coil 62*u* in the longitudinal direction of the top board 5.

Figure 2A:
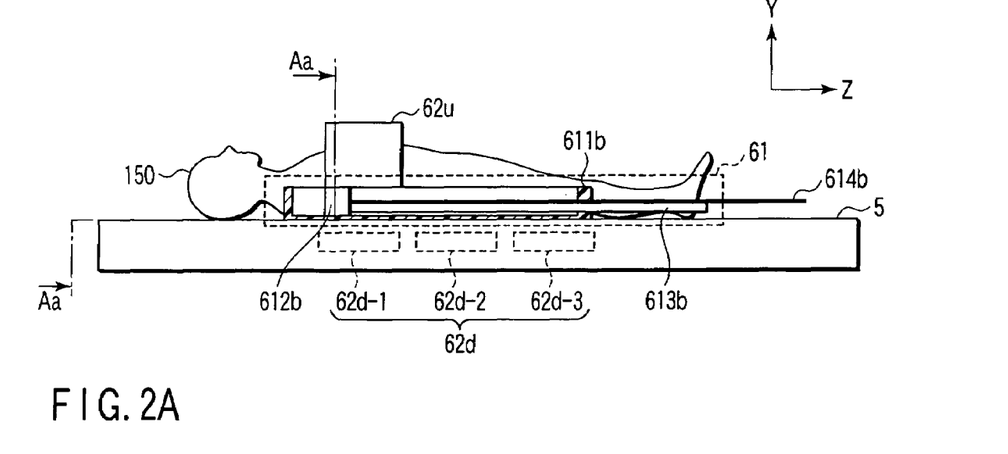
FIGS. 2A and 2B are views illustrating the structure of the RF coil unit appearing in FIG. 1.
Figure 2B:
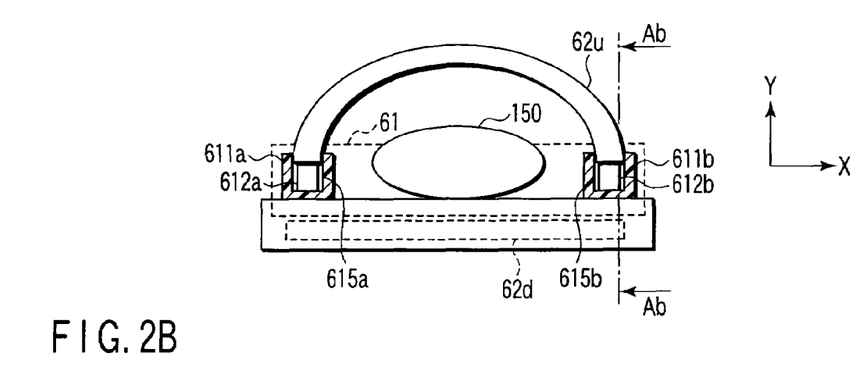

FIGS. 2A and 2B show the specific structure of the RF coil unit 6 appearing in FIG. 1. FIG. 2A is a sectional view taken along line Ab-Ab in FIG. 2B. FIG. 2B is a sectional view taken along line Aa-Aa in FIG. 2A.

As shown in FIGS. 2A and 2B, the coil support unit 61 includes support members 611*a* and 611*b*, connection ports 612*a* and 612*b*, cable-holding members 613*a* and 613*b*, signal cables 614*a* and 614*b* and guide grooves 615*a* and 615*b*.

The support members 611*a* and 611*b* are rectangular parallelepiped formed of a resin. These members are fixed on the upper surface of the top board 5 and have a length substantially equal to the length of the top board 5. The support members 611*a* and 611*b* are separate from each other by a distance that is required to place the subject 150 on the top board 5 without being interfered by the support members 611*a* and 611*b*. Guide grooves 615*a* and 615*b* are formed in the upper surfaces of the support members 611*a* and 611*b* in the longitudinal direction of the members. The guide grooves 615*a* and 615*b* extend up to the portions near the opposite ends of the support members 611*a* and 611*b*.

The connection ports 612*a* and 612*b* are supported by the support members 611*a* and 611*b*, respectively, so that they can slide along the guide grooves 615*a* and 615*b*. The opposite ends of the upper RF coil 62*u* can be attached with and detached from the connection ports 612*a* and 612*b*. When the connection ports 612*a* and 612*b* are attached with the opposite ends of the upper RF coil 62*u*, they support the coil 62*u*. Further, when the connection ports 612*a* and 612*b* are attached with the opposite ends of the upper RF coil 62*u*, they electrically connect the upper RF coil 62*u* to the signal cables 614*a* and 614*b*. To move the upper RF coil 62*u*, the connection ports 612*a* and 612*b* are moved by the RF-coil-moving mechanism of the moving mechanism 10. To this end, the RF-coil-moving mechanism has a parallel moving mechanism including, for example, wire ropes or pulleys for enabling the connection ports 612*a* and 612*b* to move parallel.

The cable-holding members 613*a* and 613*b* are rod or cylindrical members formed of a resin. One end of each of the members 613*a* and 613*b* is attached to the corresponding one of the connection ports 612*a* and 612*b*. The cable-holding members 613*a* and 613*b* are fitted in the guide grooves 615*a* and 615*b*, respectively, and protrude to the outside through the support members 611*a* and 611*b*, respectively. The cable-holding members 613*a* and 613*b* support the signal cables 614*a* and 614*b*, and guide them through the guide grooves 615*a* and 615*b* to the outside of the support members 611*a* and 611*b*. The cable-holding members 613*a* and 613*b* further define the positions of the signal cables 614*a* and 614*b* at the outside of the support members 611*a* and 611*b*.

The signal cables 614*a* and 614*b* electrically connect the upper RF coil 62*u* to the transmitter 31 and receiver 32, thereby transferring transmission signals and MR signals.

The upper RF coil 62*u* is formed by accommodating an element coil in a curved case of a thin plate. Accordingly, when the upper RF coil 62*u* is attached to the connection ports 612*a* and 612*b*, a space is defined between the coil 62*u* and top board 5 for receiving the subject 150, as shown in FIG. 2B. However, the shape of the case is not limited to this, but may be an arbitrary one. It is sufficient if a space for receiving the subject 150 is defined between the coil 62*u* and top board 5.

The lower coil unit 62*d* includes a plurality of lower RF coils. Although the number of lower RF coils may be set to an arbitrary value, the embodiment employs three lower RF coils 62*d*-1, 62*d*-2 and 62*d*-3. The lower RF coils 62*d*-1, 62*d*-2 and 62*d*-3 are arranged along the length of the top board 5. The lower RF coils 62*d*-1, 62*d*-2 and 62*d*-3 can transmit an RF pulse and can detect an MR signal. Each of the lower RF coils 62*d*-1, 62*d*-2 and 62*d*-3 is connected to the transmitter 31 and receiver 32. Each of the lower RF coils 62*d*-1, 62*d*-2 and 62*d*-3 may be formed of a single element coil or a plurality of element coils.

Figure 3A:
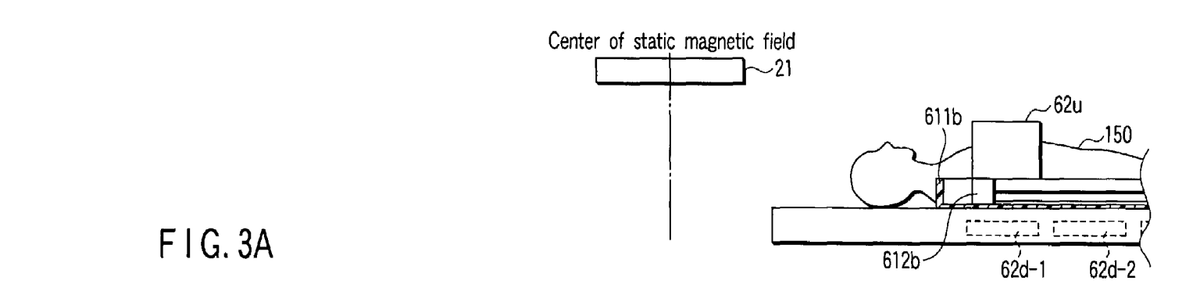
FIGS. 3A, 3B and 3C are views illustrating movements of the top board and upper RF coil appearing in FIG. 1.
Figure 3B:
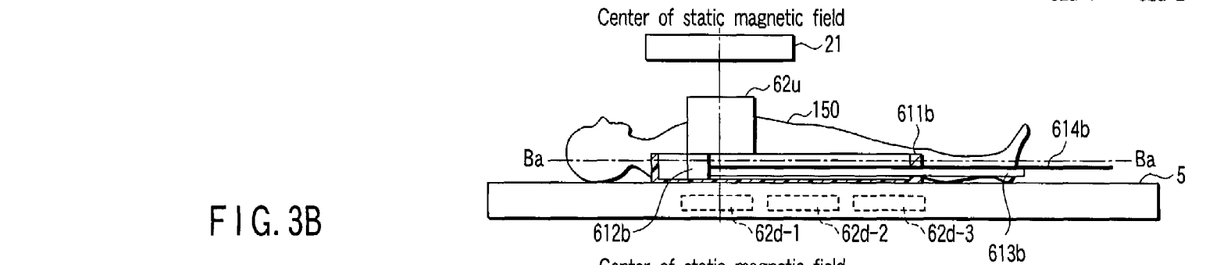
Figure 3C:
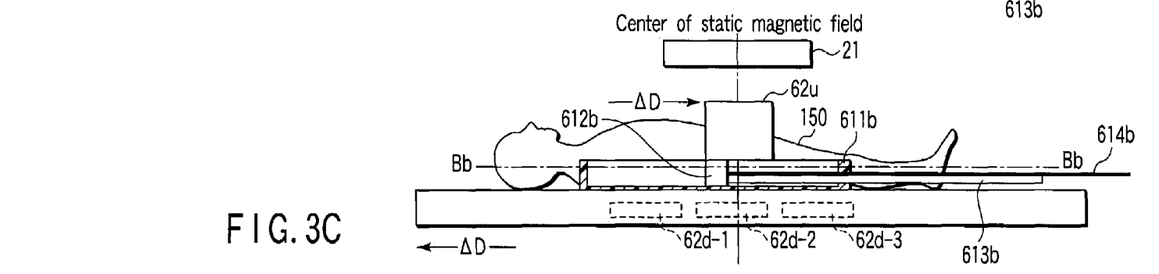

FIGS. 3A, 3B and 3C are view illustrating the movement of the top board 5 and upper RF coil 62*u*.

Where the top board 5 is pulled out of the gantry, and the upper RF coil 62*u* is removed from the connection ports 612*a* and 612*b*, the subject 150 can be easily placed on the top board 5. Where the top board 5 is thus pulled out of the gantry, the moving-mechanism control circuit 93 positions the connection ports 612*a* and 612*b* in the ends of the guide grooves 615*a* and 615*b* close to the gantry. FIG. 3A shows a state in which the top board 5 is pulled out of the gantry, the subject 150 is placed on the top board 5, and the upper RF coil 62*u* is attached with the connection ports 612*a* and 612*b*.

When imaging a certain portion of the subject 150, it is necessary to position the portion near the center of the static magnetic field. To this end, the moving-mechanism control circuit 93 operates the moving mechanism 10 to guide the top board 5 into the gantry, with the result that the top board 5 is moved leftward in FIG. 3A. The subject 150 and coil support unit 61 are moved along with the top board 5. At this time, however, the moving-mechanism control circuit 93 does not move the connection port 612*a* or 612*b*. Accordingly, the upper RF coil 62*u* is also moved along with the top board 5.

When the upper RF coil 62*u* reaches the center of the static magnetic field as shown in FIG. 3B, the moving-mechanism control circuit 93 starts to move the connection ports 612*a* and 612*b*, while continuing to move the top board 5. At this time, the moving-mechanism control circuit 93 moves the connection ports 612a and 612b at the same speed as the top board 5 but in the direction opposite to that of the top board 5.

At this time, the connection ports 612a and 612b are moved along the guide grooves 614a and 614b relative to the top board 5. However, since the movement of the top bard 5 is also continued, the connection ports 612a and 612b are kept at the position at which they start to move. Accordingly, the upper RF coil 62u is kept at the center of the static magnetic field. For instance, when the top board 5 is moved leftward by ΔD from the position shown in FIG. 3B, the connection ports 612a and 612b are moved rightward by ΔD relative to the support members 611a and 611b, as is shown in FIG. 3C. At this time, however, since the support members 611a and 611b are also moved leftward by ΔD along with the top board 5, the connection ports 612a and 612b do not shift relative to the static magnetic field, and hence the upper RF coil 62u is kept at the center of the static magnetic field as shown in FIG. 3C.

Figure 4:
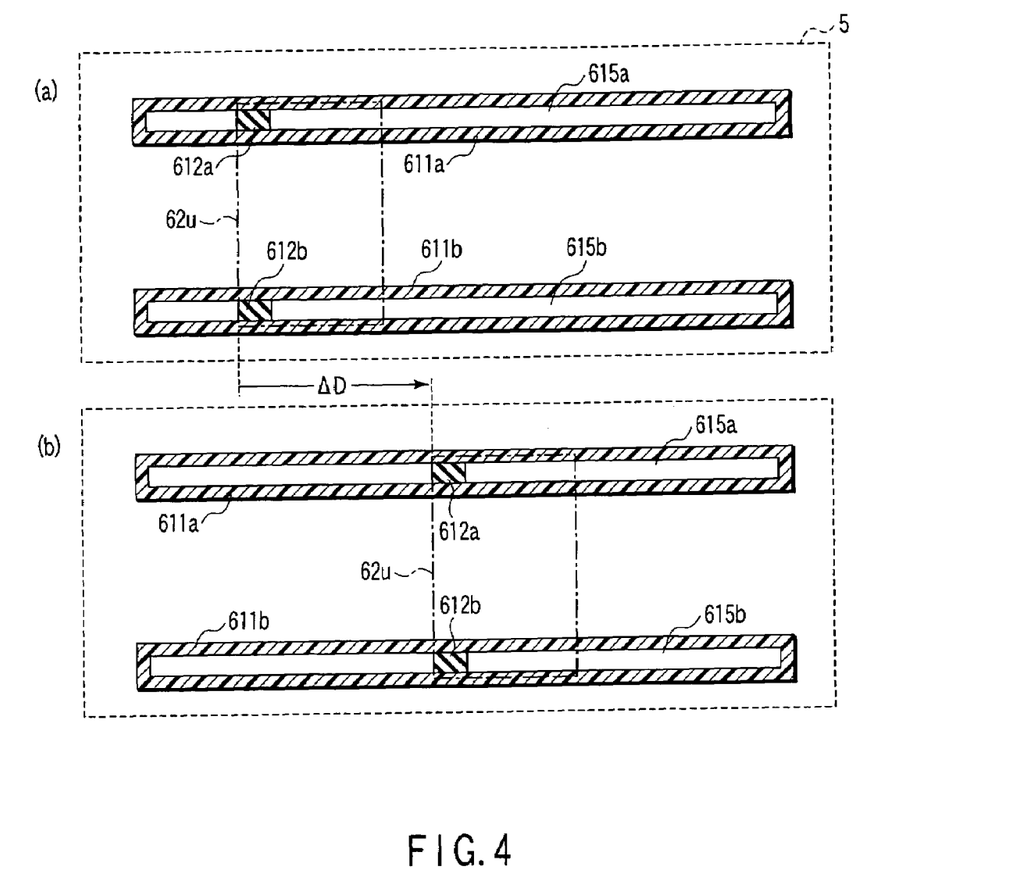
FIG. 4 is views useful in explaining the movements of connection ports for realizing the movements of the upper RF coil shown in FIGS. 3A to 3C.

FIG. 4 is views useful in explaining the movements of the connection ports 612a and 612b for realizing the movements of the upper RF coil 62u shown in FIGS. 3A to 3C. Specifically, (a) of FIG. 4 is a sectional view taken along line Ba-Ba in FIG. 3B, and (b) of FIG. 4 is a sectional view taken along line Bb-Bb in FIG. 3C. In these views, the positions of the support members 611a and 611b are aligned for convenience.

While the upper RF coil 62u is situated at the center of the static magnetic field, the subject 150 is moved through the static magnetic field along with the top board 5. Thus, the imaging target portion (to-be-imaged portion) can be changed arbitrarily. For instance, in the state shown in FIG. 3B, the imaging target portion is the breast of the subject, while in the state shown in FIG. 3C, it is the lumbar part.

The lower coil unit 62d is moved along with the top board 5. If the lower coil unit 62d is used to output an RF pulse signal or detect an MR signal, the transmitter 31 and receiver 32 select, from the lower RF coils 62d-1, 62d-2 and 62d-3, the lower RF coil positioned at the center of the static magnetic field. For example, in the state shown in FIG. 3B, the lower RF coil 62d-1 is selected, and in the state shown in FIG. 3C, the lower RF coil 62d-2 is selected.

Figure 5:
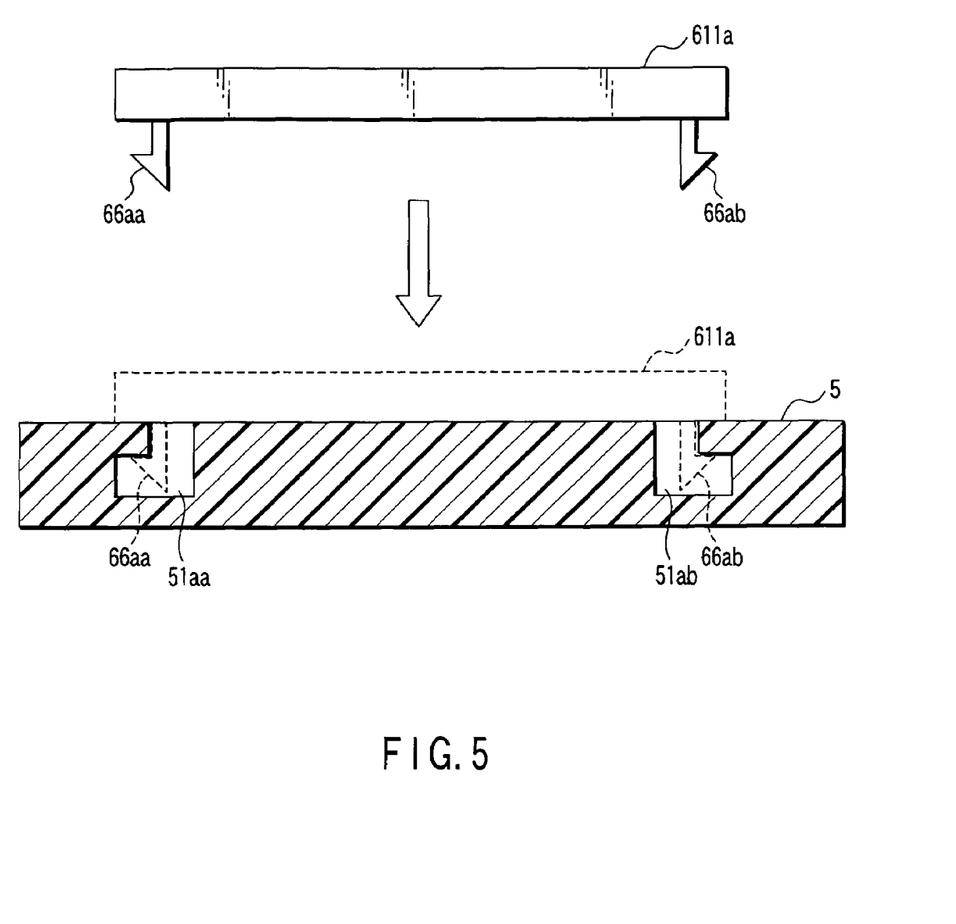
FIG. 5 is a view illustrating a lock mechanism incorporated in the support member shown in FIG. 2.

When performing imaging with the upper RF coil 62u fixed on the top board 5, it is desirable to remove the support members 611a and 611b. Namely, it is desirable that the support members 611a and 611b be easily attached to and detached from the top board 5. Therefore, in the embodiment, lock mechanisms 66aa and 66ab are attached to the opposite ends of the support member 611a as shown in FIG. 5. Similar lock mechanisms are attached to the other support member 611b. The support member 611a can be easily attached to the top board 5 by inserting the lock mechanisms 66aa and 66ab into holes 51aa and 51ab formed in the top board 5, respectively. The same can be said of the attachment of the other support member 611b to the top board 5.

As described above, in the embodiment, since the RF coil unit 6 is moved in accordance with the movement of the top board 5, it can be positioned outside the gantry. This facilitates the maintenance of the upper RF coil 62u and lower RF coil unit 62d.

Further, in the embodiment, the upper RF coil 62u is movable on the top board 5. Therefore, if the head of the subject 150 is not an imaging target, it can be positioned away from the upper RF coil 62u.

Furthermore, since the upper RF coil 62u is movable on the top board 5 relative to the subject, it can perform imaging on a wide area of the subject even if it is small. Namely, such a small upper RF coil covers only a small portion of the subject at a time, which reduces the feeling of oppression of the subject. Further, since the lower RF coil unit 62d is formed of a plurality of lower RF coils longitudinally arranged, it is not necessary to move the coil unit 62d to cover a wide area of the subject. This simplifies the structure of the moving mechanism 10. Further, since the lower RF coil unit 62d is buried in the top board 5, even if it has a large size, it does not give a feeling of oppression to the subject.

Also, in the embodiment, the connection ports 612a and 612b are moved to thereby move the upper RF coil 62u attached therewith. This structure makes it easier to engage and disengage the upper RF coil 62u than in the structure where the upper RF coil 62u is directly moved.

In the embodiment, the movement of the upper RF coil 62u in accordance with the movement of the top board 5 is automatically controlled to keep the upper RF coil 62u at the center of the static magnetic field. Accordingly, it is not necessary to operate the top board 5 and the upper RF coil 62u, individually.

In addition, the cable-holding members 613a and 613b, which are contained in the guide grooves 615a and 615b and protrude to the outside through the support members 611a and 611b, hold the signal cables 614a and 614b, respectively. Accordingly, the positions of the signal cables 614a and 614b on the top board 5 can be reliably controlled so as not to contact the subject 150. Therefore, even if the signal cables 614a and 614b generate heat during RF radiation, the subject 150 is prevented from being damaged by the heat. To minimize thermal injury, the Center for Devices and Radiological Health (CDRH) of the Food and Drug Administration (FDA) of the USA provides guidelines concerning the handling of signal cables for preventing the signal cables from directly contacting subjects. The apparatus of the embodiment clear the guidelines.

The embodiment can be modified in various ways as follows:

The upper RF coil 62u or the lower RF coils 62d-1, 62d-2 and 62d-3 may be used only for RF pulse transmission or for MR signal reception. For instance, all the upper RF coil 62u and lower RF coils 62d-1, 62d-2 and 62d-3 may be used only for MR signal reception. However, in this case, it is necessary to prepare another RF coil for RF pulse transmission. Both the RF coil for reception and the RF coil for transmission may be made movable as the upper RF coil 62u. Alternatively, only the RF coil for reception may be made movable, and the RF coil for transmission may be fixed in the gantry.

The number of the support members, connection ports, cable-holding members or signal cables incorporated in the coil support unit 61 is not limited to two, but may be one, or three or more.

Guide grooves corresponding to the guide grooves 615a and 615b may be formed in the upper surface of the top board 5 for guiding therethrough the connection ports.

The upper RF coil 62u may be set at a position deviating from the center of the static magnetic field. However, it is desirable to set the upper RF coil 62u at a position for enabling the coil 62u to exhibit desired performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coil support unit for use in a magnetic resonance imaging apparatus provided with a top board for placing thereon a subject, and a radio frequency coil provided on an upper surface of the top board, the magnetic resonance imaging apparatus imaging the subject utilizing the radio frequency coil, the coil support unit comprising:

a port configured to electrically connect the radio frequency coil to a signal cable, the signal cable transmitting at least one of a transmission signal supplied to the radio frequency coil, and a magnetic resonance signal detected by the radio frequency coil;

a support member provided on the upper surface of the top board and including a guide groove formed therein, the guide groove permitting the port to slide therein; and a holding member which holds the signal cable and has an end fixed to the port.

2. The coil support unit according to claim 1, wherein the port permits an end portion of the radio frequency coil to be attached therewith and detached therefrom.

3. The coil support unit according to claim 1, wherein the port is moved along the guide groove in accordance with movement of the radio frequency coil.

4. The coil support unit according to claim 1, wherein the guide groove extends in a body axis direction of the top board.

5. The coil support unit for use in a magnetic resonance imaging apparatus provided with a top board for placing thereon a subject, and a radio frequency coil provided on an upper surface of the top board, the magnetic resonance imaging apparatus imaging the subject utilizing the radio frequency coil, the coil support unit comprising:

a port configured to electrically connect the radio frequency coil to a signal cable, the signal cable transmitting at least one of a transmission signal supplied to the radio frequency coil, and a magnetic resonance signal detected by the radio frequency coil; and a support member provided on the upper surface of the top board and including a guide groove formed therein, the guide groove permitting the port to slide therein;

wherein the support member is permitted to be attached to and detached from the top board, and further includes a lock mechanism which locks the support member to the top board when the support member is attached to the top board.

6. A magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising:

a coil support unit supporting the radio frequency coil and including:

a port configured to electrically connect the radio frequency coil to a signal cable, the signal cable transmitting at least one of a transmission signal supplied to the radio frequency coil, and the magnetic resonance signal, and a support member provided on an upper surface of the top board and including a guide groove formed therein, the guide groove permitting the port to slide therein;

wherein the support member is permitted to be attached to and detached from the top board, and further includes a lock mechanism which locks the support member to the top board when the support member is attached to the top board.

7. The magnetic resonance imaging apparatus according to claim 6, wherein the port permits an end portion of the radio frequency coil to be attached therewith and detached therefrom.

8. The magnetic resonance imaging apparatus according to claim 6, further comprising a holding member which holds the signal cable and has a portion fixed to the port.

9. The magnetic resonance imaging apparatus according to claim 6, wherein the port is moved along the guide groove in accordance with movement of the radio frequency coil.

10. The magnetic resonance imaging apparatus according to claim 6, wherein the guide groove extends in a body axis direction of the top board.

11. The magnetic resonance imaging apparatus according to claim 6, further comprising:

a top-board-moving unit configured to move the top board; and a coil-moving unit configured to move the radio frequency coil in a direction opposite to a direction in which the top board is moved.

12. A magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising:

a coil support unit supporting the radio frequency coil and including:

a port configured to electrically connect the radio frequency coil to a signal cable, the signal cable transmitting at least one of a transmission signal supplied to the radio frequency coil, and the magnetic resonance signal;

a support member provided on an upper surface of the top board and including a guide groove formed therein, the guide groove permitting the port to slide therein;

a top-board-moving unit configured to move the top board; and a coil-moving unit configured to move the radio frequency coil in a direction opposite to a direction in which the top board is moved;

wherein the coil-moving unit moves the radio frequency coil at substantially a same speed as a moving speed of the top board.

13. A radio frequency coil unit for use in a magnetic resonance imaging apparatus for imaging a subject placed on a top board and positioned in a static magnetic field, based on a magnetic resonance signal emitted from the subject when a gradient magnetic field and a radio frequency pulse are applied to the subject, the radio frequency coil unit comprising:

at least one radio frequency coil configured to perform at least one of transmission of the radio frequency pulse and detection of the magnetic resonance signal;

a port configured to electrically connect the at least one radio frequency coil to a signal cable, the signal cable transmitting at least one of a transmission signal supplied to the at least one radio frequency coil, and a magnetic resonance signal detected by the at least one radio frequency coil;

a slide unit configured to slide the port in a body axis direction of the top board;

a coil support member including a guide groove which permits the port to slide therein, the coil support member supporting, on the top board, the at least one radio frequency coil connected to the port; and a signal cable which transmits at least one of a transmission signal supplied to the at least one radio frequency coil, and a magnetic resonance signal detected by the at least one radio frequency coil, and wherein the guide groove guides the signal cable into the coil support member.

14. The radio frequency coil unit according to claim 13, wherein the at least one radio frequency coil is slidable in the body axis direction of the top board, and the coil support member is interposed between the at least one radio frequency coil and the top board.

15. The radio frequency coil unit according to claim 13, wherein the coil support member includes a plurality of guide grooves parallel to each other and similar to the guide groove.

16. The magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus comprising:

a port configured to electrically connect the radio frequency coil to a signal cable, the signal cable transmitting at least one of a transmission signal supplied to the radio frequency coil, and the magnetic resonance signal;

a support member provided on an upper surface of the top board and including a guide groove formed therein, the guide groove permitting the port to slide therein;

a moving unit configured to move the port along the guide groove; and a control unit which stops the moving unit until the radio frequency coil reaches a predetermined position in accordance with movement of the top board, and moves the radio frequency coil at substantially a same speed as a moving speed of the top board in a direction opposite to a moving direction of the top board after the radio frequency coil reaches the predetermined position.

17. A control method for controlling a magnetic resonance imaging apparatus in which at least one of transmission of a radio frequency pulse to a subject placed on a top board, and detection of a magnetic resonance signal emitted from the subject is performed, utilizing a radio frequency coil positioned close to a desired imaging target portion of the subject, the magnetic resonance imaging apparatus including:

a port configured to electrically connect the radio frequency coil to a signal cable, the signal cable transmitting at least one of a transmission signal supplied to the radio frequency coil, and the magnetic resonance signal;

a support member provided on an upper surface of the top board and including a guide section which permits the port to slide along the guide section; and a moving unit configured to move the port along the guide section, the control method comprising:

stopping the moving unit until the radio frequency coil reaches a predetermined position in accordance with movement of the top board; and moving the radio frequency coil at substantially a same speed as a moving speed of the top board in a direction opposite to a moving direction of the top board after the radio frequency coil reaches the predetermined position.

* * * * *